(12) United States Patent
Sackett et al.

(10) Patent No.: US 8,686,338 B2
(45) Date of Patent: Apr. 1, 2014

(54) METHOD AND APPARATUS FOR CONTROLLING OUTPUT OF THE SOLID-STATE IMAGER IN A BARCODE READER

(75) Inventors: William C. Sackett, Rocky Point, NY (US); Christopher W. Brock, Manorville, NY (US); Daniel F. Brown, East Northport, NY (US); Bradley S. Carlson, Huntington, NY (US); James Giebel, Centerport, NY (US); David P. Goren, Smithtown, NY (US); Michael M. Slutsky, Stony Brook, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 415 days.

(21) Appl. No.: 13/197,001

(22) Filed: Aug. 3, 2011

(65) Prior Publication Data

US 2013/0032692 A1  Feb. 7, 2013

(51) Int. Cl.
*H01L 27/00* (2006.01)

(52) U.S. Cl.
USPC ..................................... 250/208.1

(58) Field of Classification Search
USPC ........ 250/208.1, 214 R, 214.1; 348/303, 308, 348/311
See application file for complete search history.

(56) References Cited

U.S. PATENT DOCUMENTS

| | | | | |
|---|---|---|---|---|
| 7,259,361 | B2 * | 8/2007 | Nishimura | 250/208.1 |
| 7,629,914 | B2 * | 12/2009 | Muramatsu et al. | 341/164 |
| 8,004,724 | B2 * | 8/2011 | Sakamoto | 358/412 |
| 8,334,492 | B2 * | 12/2012 | Shikanai | 250/208.1 |
| 2001/0022371 | A1 * | 9/2001 | Rhodes | 257/290 |
| 2003/0137025 | A1 * | 7/2003 | Rhodes | 257/444 |
| 2004/0051123 | A1 * | 3/2004 | Rhodes | 257/215 |
| 2005/0224843 | A1 * | 10/2005 | Boemler | 257/233 |

* cited by examiner

*Primary Examiner* — Seung C Sohn
(74) *Attorney, Agent, or Firm* — Nong-Qiang Fan

(57) ABSTRACT

A method and apparatus for imaging targets with an imaging reader. The method includes: (1) capturing return light from a target over a field of view of the solid-state imager and generating image data corresponding to the target; (2) transmitting the image data from the solid-state imager to the host when the gate circuit is set to the transmitting mode; and (3) preventing the image data from transmitting to the host when the gate circuit is set to the blocking mode.

22 Claims, 5 Drawing Sheets

METHOD AND APPARATUS FOR CONTROLLING OUTPUT OF THE SOLID-STATE IMAGER IN A BARCODE READER

FIELD OF THE DISCLOSURE

The present disclosure relates generally to imaging-based barcode readers.

BACKGROUND

Various electro-optical systems have been developed for reading optical indicia, such as barcodes. A barcode is a coded pattern of graphical indicia comprised of a series of bars and spaces of varying widths. In a barcode, the bars and spaces having differing light reflecting characteristics. Some of the barcodes have a one-dimensional structure in which bars and spaces are spaced apart in one direction to form a row of patterns. Examples of one-dimensional barcodes include Uniform Product Code (UPC), which is typically used in retail store sales. Some of the barcodes have a two-dimensional structure in which multiple rows of bar and space patterns are vertically stacked to form a single barcode. Examples of two-dimensional barcodes include Code 49 and PDF417.

Systems that use one or more solid-state imagers for reading and decoding barcodes are typically referred to as imaging-based barcode readers, imaging scanners, or imaging readers. A solid-state imager generally includes a plurality of photosensitive elements or pixels aligned in one or more arrays. Examples of solid-state imagers include charged coupled devices (CCD) or complementary metal oxide semiconductor (CMOS) imaging chips.

FIG. 1 shows an imaging scanner 50 in accordance with some embodiments. The imaging scanner 50 has a window 56 and a housing 58 with a handle. The imaging scanner 50 also has a base 52 for supporting itself on a countertop. The imaging scanner 50 can be used in a hands-free mode as a stationary workstation when it is placed on the countertop. The imaging scanner 50 can also be used in a handheld mode when it is picked up off the countertop and held in an operator's hand. In the hands-free mode, products can be slid, swiped past, or presented to the window 56. In the handheld mode, the imaging scanner 50 can be moved towards a barcode on a product, and a trigger 54 can be manually depressed to initiate imaging of the barcode. In some implementations, the base 52 can be omitted, and the housing 58 can also be in other shapes.

SUMMARY

In one aspect, the invention is directed to a method of imaging targets with an imaging reader. The imaging reader includes a gate circuit operatively connected between a host and a solid-state imager that has an array of image sensors. The gate circuit has at least two operating modes including a transmitting mode and a blocking mode. The method includes: (1) capturing return light from a target over a field of view of the solid-state imager and generating image data corresponding to the target; (2) transmitting the image data from the solid-state imager to the host when the gate circuit is set to the transmitting mode; and (3) preventing the image data from transmitting to the host when the gate circuit is set to the blocking mode.

The advantages of the present invention will become apparent to those skilled in the art upon a reading of the following specification of the invention and a study of the several figures of the drawings.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
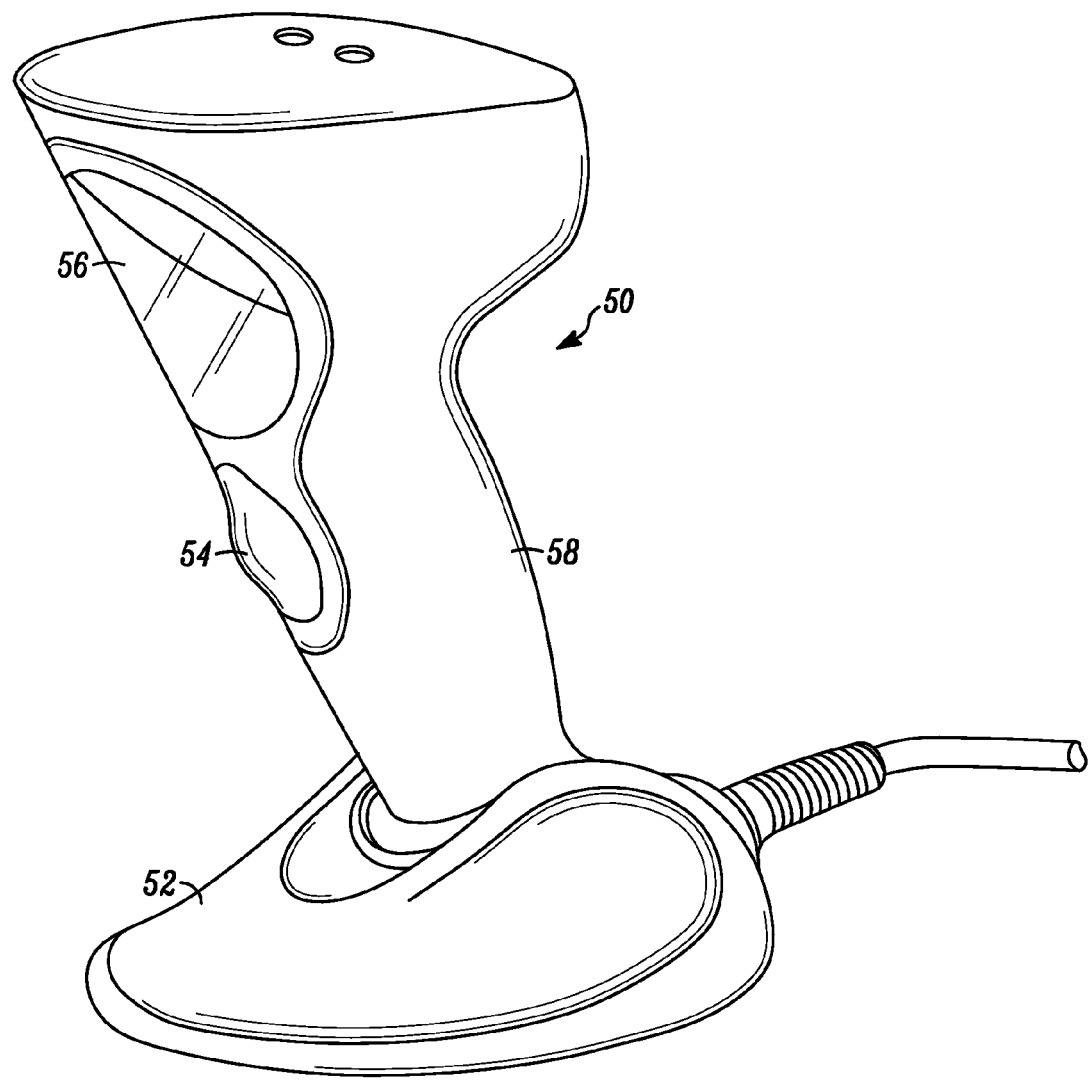
FIG. 1 shows an imaging scanner in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Figure 2:
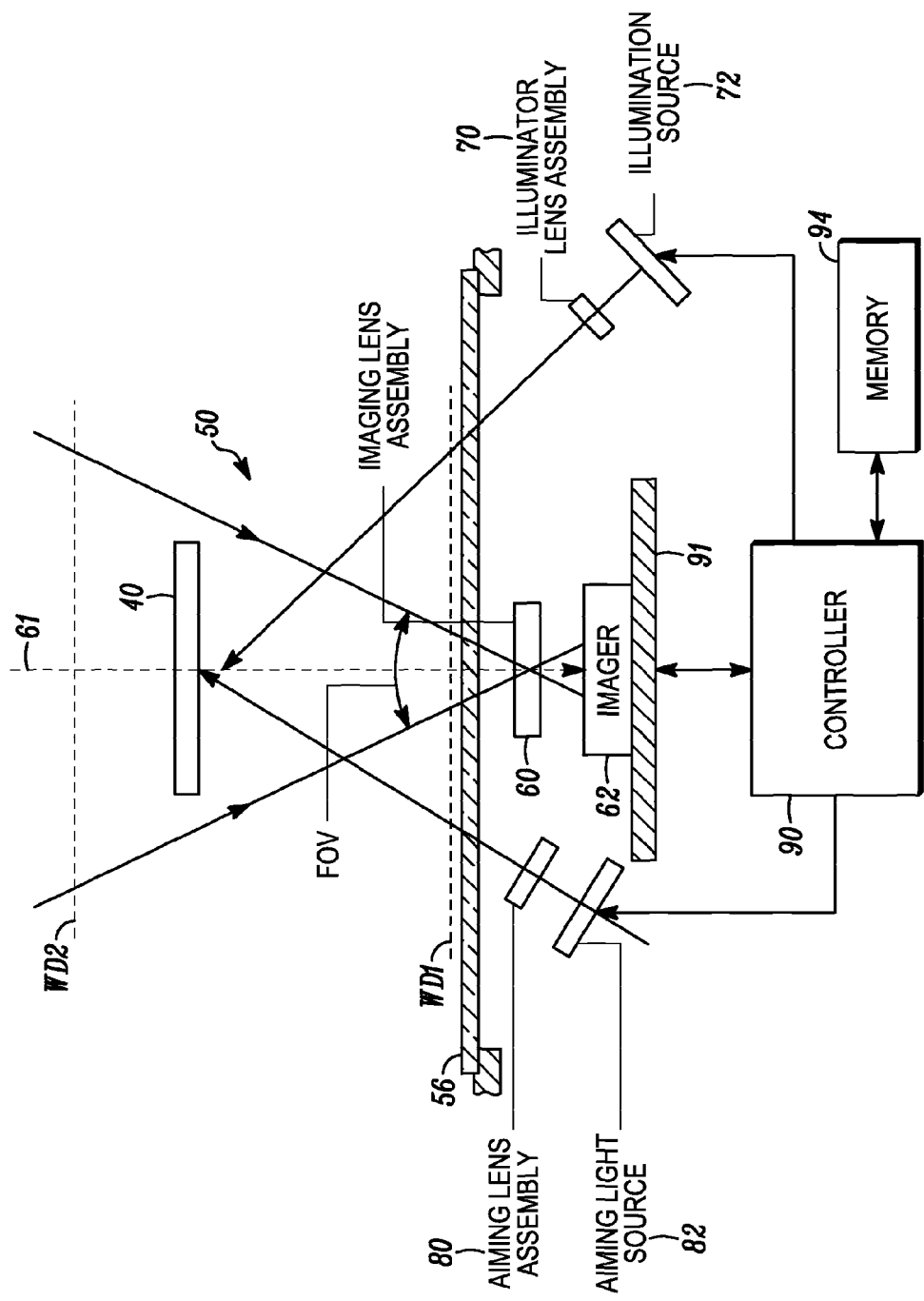
FIG. 2 is a schematic of an imaging scanner in accordance with some embodiments.

FIG. 2 is a schematic of an imaging scanner 50 in accordance with some embodiments. The imaging scanner 50 in FIG. 2 includes the following components: (1) a solid-state imager 62 positioned behind an imaging lens assembly 60; (2) an illuminating lens assembly 70 positioned in front of an illumination source 72; (3) an aiming lens assembly 80 positioned in front of an aiming light source 82; and (4) a controller 90. In FIG. 2, the imaging lens assembly 60, the illuminating lens assembly 70, and the aiming lens assembly 80 are positioned behind the window 56. The solid-state imager 62 is mounted on a printed circuit board 91 in the imaging scanner.

The solid-state imager 62 can be a CCD or a CMOS imaging device. The solid-state imager 62 generally includes multiple pixel elements. These multiple pixel elements can be formed by a one-dimensional array of photosensitive elements arranged linearly in a single row. These multiple pixel elements can also be formed by a two-dimensional array of photosensitive elements arranged in mutually orthogonal rows and columns. The solid-state imager 62 is operative to detect light captured by an imaging lens assembly 60 along an optical path or axis 61 through the window 56. Generally, the solid-state imager 62 and the imaging lens assembly 60 are designed to operate together for capturing light scattered or reflected from a barcode 40 as pixel data over a two-dimensional field of view (FOV).

The barcode 40 generally can be located anywhere in a working range of distances between a close-in working distance (WD1) and a far-out working distance (WD2). In one specific implementation, WD1 is about a few inches from the window 56, and WD2 is about a few feet from the window 56. Some of the imaging scanners can include a range finding system for measuring the distance between the barcode 40 and the imaging lens assembly 60. Some of the imaging scanners can include an auto-focus system to enable a barcode be more clearly imaged with the solid-state imager 62 based on the measured distance of this barcode. In some implementations of the auto-focus system, the focus length of the imaging lens assembly 60 is adjusted based on the measured distance of the barcode. In some other implementations of the auto-focus system, the distance between the imaging lens assembly 60 and the solid-state imager 62 is adjusted based on the measured distance of the barcode.

In FIG. 2, the illuminating lens assembly 70 and the illumination source 72 are designed to operate together for generating an illuminating light towards the barcode 40 during an illumination time period. The illumination source 72 can include one or more light emitting diodes (LED). The illumination source 72 can also include a laser or other kind of light sources. The aiming lens assembly 80 and the aiming light source 82 are designed to operate together for generating a visible aiming light pattern towards the barcode 40. Such aiming pattern can be used by the operator to accurately aim the imaging scanner at the barcode. The aiming light source 82 can include one or more light emitting diodes (LED). The aiming light source 82 can also include a laser or other kind of light sources.

In FIG. 2, the controller 90, such as a microprocessor, is operatively connected to the solid-state imager 62, the illumination source 72, and the aiming light source 82 for controlling the operation of these components. The controller 90 can also be used to control other devices in the imaging scanner. The imaging scanner 50 includes a memory 94 that can be accessible by the controller 90 for storing and retrieving data. In many embodiments, the controller 90 also includes a decoder for decoding one or more barcodes that are within the field of view (FOV) of the imaging scanner 50. In some implementations, the barcode 40 can be decoded by digitally processing a captured image of the barcode with a microprocessor.

In operation, in accordance with some embodiments, the controller 90 sends a command signal to energize the illumination source 72 for a predetermined illumination time period. The controller 90 then exposes the solid-state imager 62 to capture an image of the barcode 40. The captured image of the barcode 40 is transferred to the controller 90 as pixel data. Such pixel data is digitally processed by the decoder in the controller 90 to decode the barcode. The information obtained from decoding the barcode 40 is then stored in the memory 94 or sent to other devices for further processing.

Figure 3:
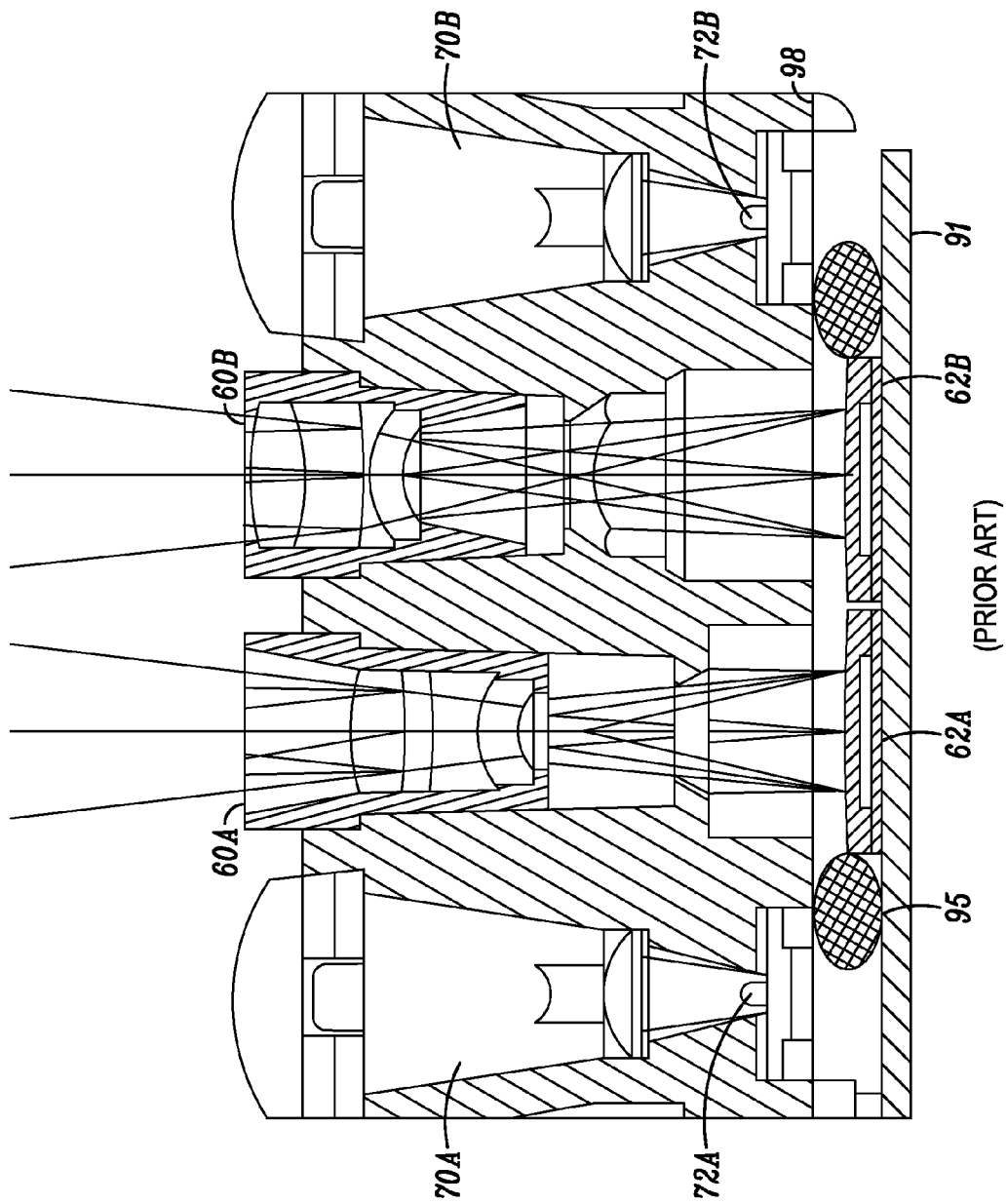
FIG. 3 depicts an imaging scanner in accordance with some existing implementations.

FIG. 3 shows an implementation of a scan engine 55 with two solid-state imagers for use in the imaging scanner 50. The scan engine 55 in FIG. 3 includes (1) a first imaging system that includes a solid-state imager 62A positioned behind an imaging lens assembly 60A and (2) a second imaging system that includes a solid-state imager 62B positioned behind an imaging lens assembly 60B. Both the solid-state imager 62A and the solid-state imager 62B are mounted on a circuit board 91. These two imaging systems are designed to provide an extended range of working distances. One of the imaging systems can be used for capturing the image of a barcode when the barcode is located near the imaging scanner 50, and the other one of the imaging systems can be used for capturing the image of a barcode when the barcode is located far away from the imaging scanner 50. The scan engine 55 in FIG. 3 also includes (1) a first illumination source 72B positioned behind a first illuminating lens assembly 70A and (2) a second illumination source 72B positioned behind a second illuminating lens assembly 70B. The illuminating lens assemblies (i.e., 70A and 70B) and the imaging lens assemblies (i.e., 70A and 70B) are all inserted into some opening spaces of a chassis 98.

On many imaging engines, the output of the image sensor is connected directly to a host that contains the decoder or a pixel data capture function. Whenever data is output from the image sensor, the host receives this data. There are many times when it would be desirable to block an image from the host. For example, the initial frame produced when a sensor is first turned on may be invalid. Alternatively, an intelligent processor on the imaging engine may instruct the sensor to produce a serious of rapid slit frames (small slices of the full image), that allow it to very quickly determine auto-exposure or auto-focus settings. In each of these cases, it is undesirable to send these images to the host.

Figure 4:
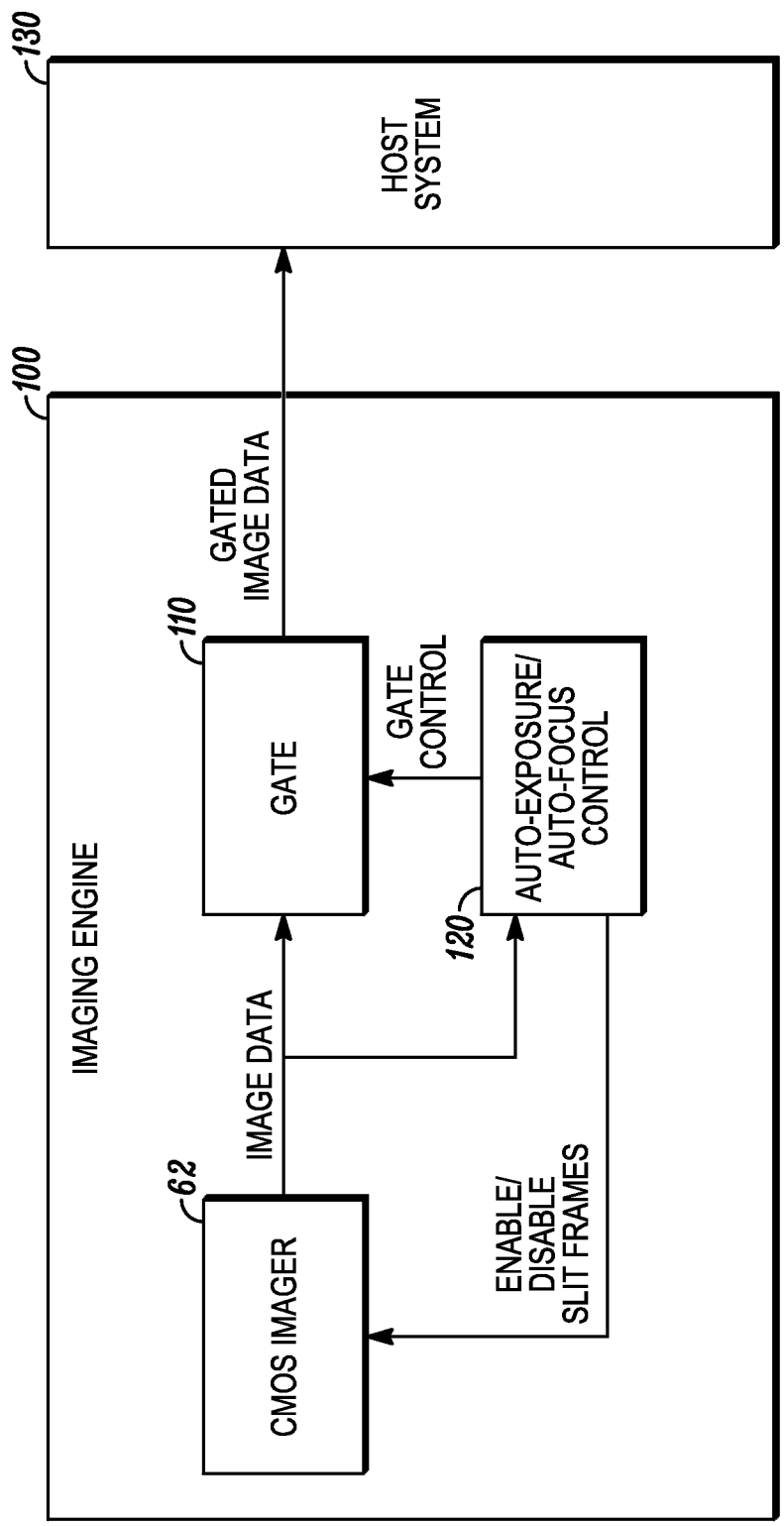
FIG. 4 depicts one embodiment of an imaging engine that allows an on-board intelligent process to block images that the host should not receive.

FIG. 4 depicts one embodiment of an imaging engine 100 that allows an on-board intelligent process to block images that the host should not receive. This intelligent process could be a programmable microprocessor or a simple hardware state-machine. The intelligent process can use the blocked image for determining auto-exposure, auto-focus, or some other setting or to simply prevent a corrupted image from reaching the host. The image is blocked through the use of discrete logic (mux, and-gate, etc.) or as part of a custom ASIC design.

In FIG. 4, the imaging engine 100 includes a solid-state imager 62, a gate circuit 110, and an auto-exposure control circuit 120. The solid-state imager 62 has an array of image sensors for capturing return light from a target over a field of view and for generating image data corresponding to the target. The gate circuit 110 is operatively connected between the solid-state imager 62 and a host 130. The gate circuit 100 is configured to receive the image data from the solid-state imager 62. The gate circuit 110 also receives a gate control signal for setting the gate circuit 110 to a specific operating mode. In the implementation as shown in FIG. 4, the operating mode includes at least a transmitting mode and a blocking mode. In some other implementations, the gate circuit 110 can also have other operating modes. In FIG. 4, the gate circuit 110 is configured to transmit the image data to the host 130 when the gate circuit 110 is set to the transmitting mode; the gate circuit 110 is also configured to prevent the image data from transmitting to the host 130 when the gate circuit is set to the blocking mode.

In FIG. 4, the auto-exposure control circuit 120 is operatively connected to the solid-state imager 62 such that it receives at least a portion of the image data from the solid-state imager 62. The auto-exposure control circuit 120 is configured to send an enabling control signal to the solid-state imager 62 and to send the gate control signal to the gate circuit 110.

In one embodiment, the blocking hardware for the gate circuit 110 and the auto-exposure control circuit 120 is part of a custom imaging ASIC that contains a programmable microprocessor. To quickly determine auto-exposure and auto-focus settings, the microprocessor places the solid-state imager 62 into a slit frame mode where only a small slice of a full image is produced. The slit frames can be sent much more rapidly than an entire image frame and they allow the processor to sample an image, change the focus or exposure settings, and then quickly sample the image again. This can be done in a fraction of the time that a set of full images would require. The slit frames are blocked from the host 130, since many host processors can not adapt to frames of varying sizes. After, the correct settings are achieved, the solid-state imager 62 is switched back to full frame mode and the full image is allowed to be sent to the host 130.

Figure 5:
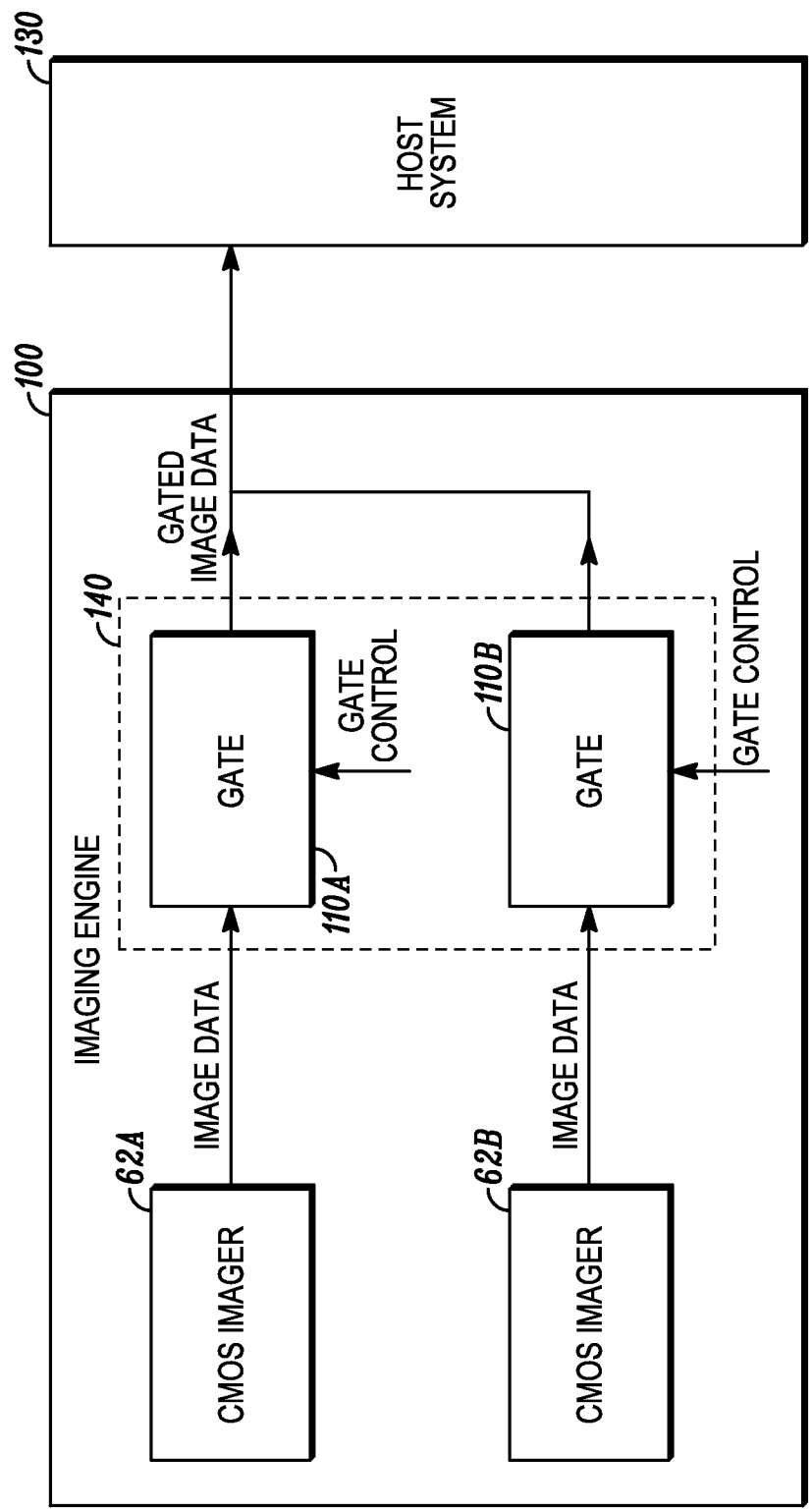
FIG. 5 depicts an imaging engine that includes a multiplexer operatively connected between two solid-state imagers and a host in accordance with some embodiments.

In another embodiment, as shown in FIG. 5, two solid-state imagers 62A and 62B are present in a single imaging engine 100. One image sensor is configured to work well with close objects, while the second image sensor is configured to work well with distant objects—one such implementation is shown in FIG. 3. In FIG. 5, only one image sensor operates at one time and their outputs are multiplexed on a single connection to the host 130 with a multiplexer 140. The multiplexer 140 can connect either sensor to the host or it can block both sensor outputs. In the implementation as shown in FIG. 5, the multiplexer 140 includes two gate circuits 110A and 110B. When a sensor is not being used, it is turned off to save power. However, when a sensor is reactivated, the first image that it produces is generally corrupted and the multiplexer 140 can be set to the blocking mode to prevent the invalid image from reaching the host. A small discrete microprocessor within the imaging engine controls the multiplexing logic.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus comprising:
a solid-state imager having an array of image sensors for capturing return light from a target over a field of view, and for generating image data corresponding to the target;
a gate circuit operatively connected between the solid-state imager and a host, the gate circuit being configured to receive the image data from the solid-state imager, the gate circuit receiving a gate control signal for setting the gate circuit to an operating mode that includes a transmitting mode and a blocking mode; and
wherein the gate circuit is configured to transmit the image data to the host when the gate circuit is set to the transmitting mode and configured to prevent the image data from transmitting to the host when the gate circuit is set to the blocking mode.

2. The apparatus of claim 1, further comprising:
a control circuit operatively connected to the solid-state imager and configured to receive at least a portion of the image data from the solid-state imager, the control circuit being configured to send the gate control signal to the gate circuit.

3. The apparatus of claim 2, wherein the control circuit is further configured to send an enabling control signal to the solid-state imager.

4. The apparatus of claim 2, wherein the solid-state imager has a slit-frame mode and wherein the control circuit is further configured to send an enabling control signal to the solid-state imager for enabling or disabling the slit frame mode of the solid-state imager.

5. The apparatus of claim 2, wherein the solid-state imager has a slit-frame mode and wherein the control circuit is operative to send the gate control signal to the gate circuit to set the gate circuit to the blocking mode when the solid-state imager is operating in the slit-frame mode.

6. The apparatus of claim 1, wherein the gate circuit is configured to operate in the blocking mode when the solid-state imager is operating in a slit-frame mode.

7. The apparatus of claim 1, wherein the gate circuit is configured to operate in the blocking mode when a control circuit receives at least a portion of the image data from the solid-state imager for determining at least an auto-exposure setting.

8. The apparatus of claim 1, wherein the gate circuit is configured to operate in the blocking mode when a control circuit receives at least a portion of the image data from the solid-state imager for determining at least an auto-focus setting.

9. The apparatus of claim 1, wherein the gate circuit is configured to change the operating mode thereof from the blocking mode to the transmitting mode after a lapse of a predetermined time since the solid-state imager is powered up.

10. The apparatus of claim 1, wherein the host includes at least one of a decoding function and a pixel data capture function.

11. A method of imaging targets with an imaging reader, the imaging reader including a gate circuit operatively connected between a host and a solid-state imager that has an array of image sensors, wherein the gate circuit has at least two operating modes including a transmitting mode and a blocking mode, the method comprising:
capturing return light from a target over a field of view of the solid-state imager and generating image data corresponding to the target;
transmitting the image data from the solid-state imager to the host when the gate circuit is set to the transmitting mode; and
preventing the image data from transmitting to the host when the gate circuit is set to the blocking mode.

12. The method of claim 11, further comprising:
setting the gate circuit to the blocking mode when the solid-state imager is operating in a slit-frame mode.

13. The method of claim 11, further comprising:
setting the gate circuit to the blocking mode when a control circuit receives at least a portion of the image data from the solid-state imager for determining at least an auto-exposure setting.

14. The method of claim 11, further comprising:
setting the gate circuit to the blocking mode when a control circuit receives at least a portion of the image data from the solid-state imager for determining at least an auto-focus setting.

15. The method of claim 11, further comprising:
changing the gate circuit from the blocking mode to the transmitting mode after a lapse of a predetermined time since the solid-state imager is powered up.

16. The method of claim 11, wherein the host includes at least one of a decoding function and a pixel data capture function.

17. An apparatus comprising:
a solid-state imager having an array of image sensors for capturing return light from a target over a field of view, and for generating image data corresponding to the target; and
an application specific integrated circuit (ASIC) including a gate circuit operatively connected between a host and the solid-state imager, the host including at least one of a decoding function and a pixel data capture function, the gate circuit having at least two operating modes including a transmitting mode and a blocking mode, the gate circuit comprises,
means for transmitting the image data from the solid-state imager to the host when the gate circuit is set to the transmitting mode, and
means for preventing the image data from transmitting to the host when the gate circuit is set to the blocking mode.

18. The apparatus of claim 17, further comprising:
means for setting the gate circuit to the blocking mode when the solid-state imager is operating in a slit-frame mode.

19. The apparatus of claim 17, further comprising:
means for setting the gate circuit to the blocking mode when a control circuit receives at least a portion of the image data from the solid-state imager for determining at least an auto-exposure setting.

20. The apparatus of claim 17, further comprising:
means for setting the gate circuit to the blocking mode when a control circuit receives at least a portion of the image data from the solid-state imager for determining at least an auto-focus setting.

21. The apparatus of claim 17, further comprising:
means for changing the gate circuit from the blocking mode to the transmitting mode after a lapse of a predetermined time since the solid-state imager is powered up.

22. A method of imaging a target with an imaging reader, the imaging reader including a first solid-state imager and a second solid-state imager each having an array of image sensors, the imaging reader also including a multiplexer operatively connected between a host and the two solid-state imagers, wherein the multiplexer has at least three operating modes including (1) a blocking mode, (2) a first transmitting mode, and (3) a second transmitting mode, the method comprising:
capturing return light from the target with the first solid-state imager and generating first image data corresponding to the target;
transmitting the first image data to the host when the multiplexer is set to the first transmitting mode;
capturing return light from the target with the second solid-state imager and generating second image data corresponding to the target;
transmitting the second image data to the host when the multiplexer is set to the second transmitting mode;
preventing any image data from transmitting to the host when the multiplexer is set to the blocking mode.

* * * * *